(12) United States Patent
Thin et al.

(10) Patent No.: US 10,764,548 B2
(45) Date of Patent: Sep. 1, 2020

(54) LUMINOUS DEVICE USING A HIGH-RESOLUTION LIGHT SOURCE

(71) Applicant: VALEO VISION, Bobigny (FR)

(72) Inventors: Guillaume Thin, Bobigny (FR); Antoine De Lamberterie, Bobigny (FR); Samira Mbata, Bobigny (FR); Thomas Canonne, Bobigny (FR); Van Thai Hoang, Bobigny (FR); Vincent Dubois, Bobigny (FR); Francois-Xavier Amiel, Bobigny (FR); Nicolas Lefaudeux, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 16/333,937

(22) PCT Filed: Jul. 26, 2017

(86) PCT No.: PCT/EP2017/068935
§ 371 (c)(1),
(2) Date: Mar. 15, 2019

(87) PCT Pub. No.: WO2018/050338
PCT Pub. Date: Mar. 22, 2018

(65) Prior Publication Data
US 2019/0215502 A1   Jul. 11, 2019

(30) Foreign Application Priority Data
Sep. 15, 2016   (FR) ...................................... 16 58652

(51) Int. Cl.
*H04N 9/31*      (2006.01)
*G06F 13/42*    (2006.01)
(Continued)

(52) U.S. Cl.
CPC ......... *H04N 9/3194* (2013.01); *B60Q 1/0017* (2013.01); *B60Q 1/085* (2013.01);
(Continued)

(58) Field of Classification Search
CPC .............. G03B 21/147; G03B 21/2013; G03B 21/2033; G03B 21/2053; H04N 9/3144;
(Continued)

(56) References Cited

U.S. PATENT DOCUMENTS

2014/0034806 A1* 2/2014 Vincen ............... G03B 21/2086
                                                                250/205
2014/0219506 A1   8/2014 Foltin
(Continued)

FOREIGN PATENT DOCUMENTS

EP        2 380 774 A1    10/2011

OTHER PUBLICATIONS

International Search Report dated Nov. 9, 2017 in PCT/EP2017/068935, 3 pages.
(Continued)

*Primary Examiner* — Sultan Chowdhury
(74) *Attorney, Agent, or Firm* — Oblon, McClelland, Maier & Neustadt, L.L.P.

(57) ABSTRACT

A luminous device for a motor vehicle, said device including a pixelized light source and an optical system that is arranged to project a pixelized light beam emitted by the pixelized light source, the optical system comprising a first mirror arranged to collect and reflect rays of the pixelized light beam emitted by the pixelized light source, a second mirror arranged to reflect the rays reflected by the first mirror, and a third mirror arranged to receive the rays reflected by the second mirror and to reflect these received
(Continued)

rays so as to correct field aberrations. The invention enables improved projection of a pixelized light beam by a luminous motor-vehicle device.

19 Claims, 3 Drawing Sheets

(51) Int. Cl.

| | | |
|---|---|---|
| H01L 27/15 | (2006.01) | |
| F21S 41/155 | (2018.01) | |
| F21S 41/663 | (2018.01) | |
| H01L 33/24 | (2010.01) | |
| B60Q 1/14 | (2006.01) | |
| B60Q 1/00 | (2006.01) | |
| H05B 45/10 | (2020.01) | |
| H05B 47/11 | (2020.01) | |
| H05B 47/105 | (2020.01) | |
| B60Q 1/08 | (2006.01) | |
| H04L 12/40 | (2006.01) | |
| F21S 41/141 | (2018.01) | |
| H01L 33/32 | (2010.01) | |
| H01L 33/00 | (2010.01) | |

(52) U.S. Cl.
CPC .......... *B60Q 1/1423* (2013.01); *F21S 41/155* (2018.01); *F21S 41/663* (2018.01); *G06F 13/42* (2013.01); *H01L 27/156* (2013.01); *H01L 33/24* (2013.01); *H04N 9/3138* (2013.01); *H04N 9/3155* (2013.01); *H05B 45/10* (2020.01); *H05B 47/105* (2020.01); *H05B 47/11* (2020.01); *B60Q 2300/054* (2013.01); *B60Q 2300/112* (2013.01); *B60Q 2300/114* (2013.01); *B60Q 2300/122* (2013.01); *B60Q 2300/132* (2013.01); *B60Q 2300/136* (2013.01); *B60Q 2300/32* (2013.01); *B60Q 2400/20* (2013.01); *F21S 41/141* (2018.01); *H01L 33/0075* (2013.01); *H01L 33/32* (2013.01); *H04L 2012/40273* (2013.01)

(58) Field of Classification Search
CPC ........ H04N 9/3194; F21S 41/16; F21S 41/60; F21S 41/141; F21S 41/155; F21S 41/663; B60Q 1/0017; B60Q 1/44; B60Q 1/085; B60Q 1/143; B60Q 1/1423; H05B 33/0218; H05B 33/0227; H05B 33/0851
See application file for complete search history.

(56) References Cited

U.S. PATENT DOCUMENTS

| | | | |
|---|---|---|---|
| 2015/0085507 A1 | 3/2015 | Hoffmann | |
| 2015/0331235 A1* | 11/2015 | Dalmayrac | G02B 27/01 345/8 |
| 2017/0144591 A1* | 5/2017 | Yatsu | F21S 41/125 |
| 2017/0160094 A1* | 6/2017 | Zhang | B60R 11/00 |

OTHER PUBLICATIONS

"TPS92661-Q1: High-Brightness LED Matrix Manager for Automotive Headlight Systems" Texas Instruments, XP055348745, Feb. 1, 2016, pp. 1-53.

\* cited by examiner

LUMINOUS DEVICE USING A HIGH-RESOLUTION LIGHT SOURCE

FIELD OF THE INVENTION

The invention relates to the field of luminous land-vehicle devices, i.e. devices allowing, during use of the vehicle, light to be projected so as to illuminate the road or the passenger compartment and/or so as to allow the vehicle to be made more visible. Examples of such luminous devices are position lights or low-beam and/or high-beam lights (commonly referred to as "headlights").

BACKGROUND

Land vehicles are equipped with luminous devices, in particular lighting and/or signaling devices, such as headlamps or rear lights, that are intended to illuminate the road in front of the vehicle at night or in case of low visibility. They may also serve to illuminate the passenger compartment of the vehicle. These luminous devices may comprise one or more luminous modules. Each lighting function may be performed by one or more modules.

In these luminous land-vehicle modules, electroluminescent light sources (solid-state lighting arrays for example) are more and more frequently used. These light sources may consist of light-emitting diodes or LEDs, of organic light-emitting diodes or OLEDs, or even of polymer light-emitting diodes or PLEDs. These light sources have advantages in particular in terms of bulk and lifetime with respect to conventional light sources such as incandescent bulbs for example.

Furthermore, high-pixel-density electroluminescent light sources, also known as monolithic LED arrays, are known. In this context, the LEDs are also referred to as pixels. These high-density light sources make it possible to select with a very great precision which zones of a scene are illuminated and with which light intensity. A monolithic array comprises several thousand LEDs that are located on the same substrate, the LEDs being separated from the others by lanes or streets. Each of the LEDs is electrically independent from the others and therefore illuminates autonomously from the other LEDs of the array.

In order to be able to take advantage of these high-pixel-density light sources, for example to implement anti-glare functions, it is necessary to be able to individually control the constituent electroluminescent elements (the pixels) of the monolithic array. However, at the present time, an architecture allowing high-pixel-density light sources to be driven does not exist.

SUMMARY OF THE INVENTION

To this end a luminous land-vehicle device for illuminating a scene is provided. This device comprises a monolithic electroluminescent source comprising electroluminescent elements, an optical system arranged to form an image of the monolithic electroluminescent source, and an electronic device able to—receive at least one first measurement regarding at least one physical parameter of the vehicle—receive at least one second measurement regarding at least one physical parameter of the scene, and—control the electroluminescent elements of the source depending on the received first and/or second measurements.

According to various examples, the luminous device may comprise one or more of the following features combined together:

the electronic device comprises at least one power converter and/or one integrated circuit;
the electronic device receives the first and second measurements asynchronously;
the reception frequency of the first measurements is at least three times higher than that of the second measurements;
at least one first sensor that generates the first measurements;
at least one second sensor that generates the second measurements;
the second sensor is a camera that produces an image stream;
the second sensor furthermore comprises a unit for analysing the image stream produced by the camera;
the analysing unit carries out segmenting operations on the images of the image stream;
a heatsink arranged on at least the monolithic electroluminescent source;
the optical system has a resolution that is lower than or equal to 0.25 degrees and a field larger than or equal to 5 degrees.

A method for illuminating a scene with the above luminous device is also provided, this method comprising steps in which:

(i) the electronic device receives a first measurement of at least one physical parameter of the vehicle;
(ii) the electronic device determines which electroluminescent elements of the monolithic electroluminescent source must be turned on depending on the received first measurement;
(iii) the electronic device configures at least the electroluminescent elements determined in step (ii) so that they emit light.

This method may furthermore comprise:
after step (iii), steps in which:
(iv) the electronic device receives a second measurement of at least one physical parameter of the scene;
(v) the electronic device determines which electroluminescent elements of the monolithic electroluminescent source must be turned on depending on the received second measurement;
(vi) the electronic device configures at least the electroluminescent elements determined in step (v) so that they emit light.
after step (iii), steps in which:
(iv) the electronic device receives second and third measurements of at least two physical parameters of the scene;
(v) the received second and third measurements are fused;
(vi) the electronic device receives a new first measurement of at least one physical parameter of the vehicle;
(vii) the electronic device determines which electroluminescent elements of the monolithic electroluminescent source must be turned on depending on the received new first measurement and the received second and third measurements;
(viii) the electronic device configures at least the electroluminescent elements determined in step (vii) so that they emit light.
steps (i), (ii) and (iii) are repeated provided that a second measurement of a physical parameter of the scene has not been received.

BRIEF DESCRIPTION OF THE FIGURES

Various embodiments of the invention will now be described, by way of completely nonlimiting example, with reference to the appended drawings, in which.

DETAILED DESCRIPTION

Figure 3:
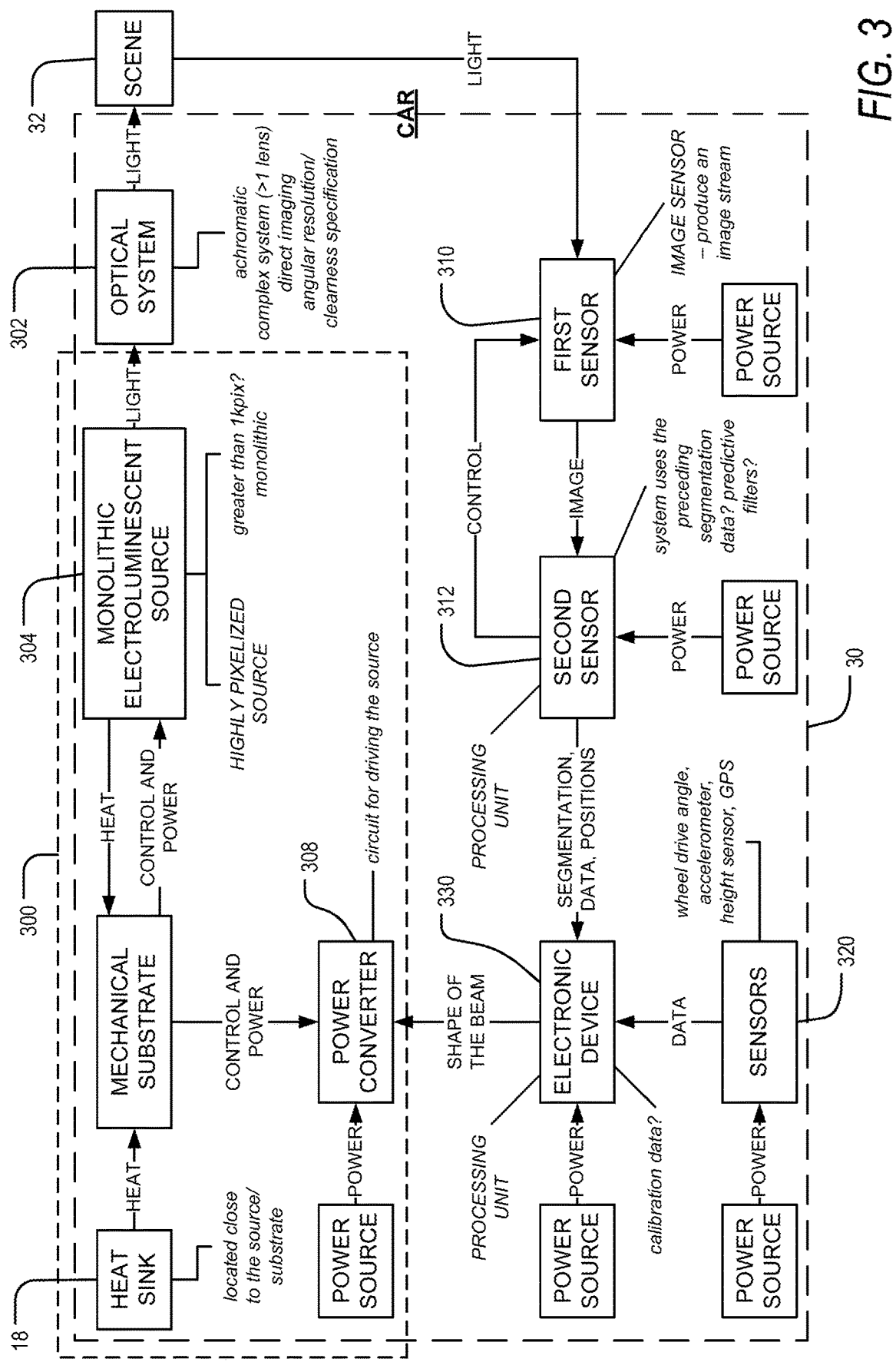
FIG. 3 schematically shows one example of a luminous device according to the invention.

FIG. 3 shows one example of a luminous device 30 according to the invention. The luminous device may be included in a land vehicle in order to illuminate a scene 32, i.e. the volume of space that needs to be illuminated, a road for example.

The luminous device 30 comprises a monolithic electroluminescent source that is a solid-state lighting array that comprises a high number of electroluminescent elements; typically this number is higher than 1000 electroluminescent elements. An electroluminescent element may be, non-limitingly, a light-emitting diode (LED), an organic light-emitting diode (OLED) or a polymer light-emitting diode (PLED). The electroluminescent source is therefore a semiconductor light source and it includes a substrate on which the electroluminescent elements are placed. An electroluminescent element is more generally called a pixel. Therefore, the light source comprises a plurality of pixels deposited on or extending from the first face of the substrate.

The electroluminescent elements may each be semiconductor, i.e. they may each include at least one semiconductor. The electroluminescent elements may mainly be made of semiconductor. This semiconductor may be the same as or different from the material of the substrate. The electroluminescent elements may more generally all be produced from the same material or materials. The electroluminescent elements may be of the same nature and, for example, be substantially identical or similar. All the electroluminescent elements may be positioned to form a regular pattern, a grid for example.

The elements are electroluminescent. This means that they emit light when the material of the electroluminescent elements is supplied with electricity. The electroluminescent elements use electroluminescence to emit light. Electroluminescence is an optical and electrical effect during which a material emits light in response to an electrical current flowing therethrough, or to a strong electric field. It is to be distinguished from light emission due to temperature (incandescence) or to the action of chemical products (chemiluminescence). A pixel may be said to be turned on when an electroluminescent element emits light.

The electroluminescent source is a monolithic electroluminescent source, also referred to as a high-pixel-density solid-state lighting array. A monolithic array comprises hundreds or thousands of electroluminescent elements that are located on the same substrate, and preferably on the same face of the substrate, which may for example be made of sapphire. The LEDs of the monolithic array are separated from one another by lanes or streets. The monolithic array is therefore a grid of electroluminescent elements or even a grid of pixels. The electroluminescent elements may be LEDs; in this case, a monolithic LED array is spoken of. Any other technology may be envisioned, such as for example organic light-emitting diodes (OLEDs) or polymer light-emitting diodes (PLEDs), etc.

The monolithic electroluminescent source is a high-density source, i.e. it comprises a very high number of electroluminescent elements, at least several hundred electroluminescent elements. In practice, the source includes more than 500 electroluminescent elements on the same substrate. The pixel density is preferably higher than 500 pixels per $cm^2$. It is typically comprised between 500 and 2500 pixels per $cm^2$. It will be understood that the pixel density of a light source of high light-element density may be higher than 2500 pixels per $cm^2$.

Each of the electroluminescent elements of the array is electrically independent from the others and emits or does not emit light independently from the other elements of the array. Each element of the array is controlled individually by an electronic circuit called a driver. The driver manages the supply of electrical power to the monolithic array, this amounting to saying that it individually manages the supply of electrical power to each electroluminescent element. Alternatively, electroluminescent elements may be grouped together electrically, for example by supplying them with electrical power via a parallel or series set-up, in order to decrease the number of elements to be managed. For example, the groups may comprise between two and four electroluminescent elements, this number allowing a sufficiently pixelized light beam to be preserved. The driver is therefore an electronic device that is able to control the elements of a monolithic array of electroluminescent elements. A plurality of drivers may be used to control the electroluminescent elements of the array.

The monolithic electroluminescent source may be comprised in a luminous module 300. It will be understood that the luminous module may have a plurality of monolithic electroluminescent sources. A plurality of luminous modules comprising such a monolithic electroluminescent source may be integrated into the luminous device according to the invention. The term "luminous module" therefore designates at least one monolithic electroluminescent source.

Figure 1:
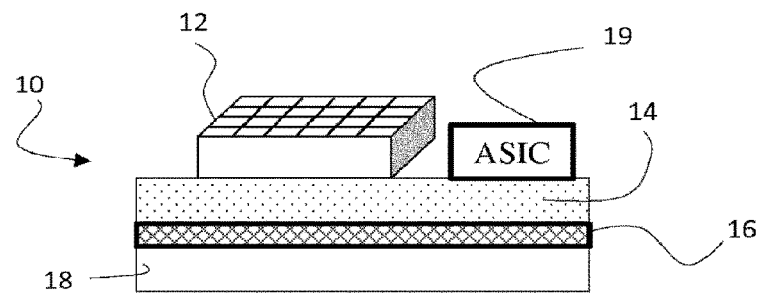
FIG. 1 schematically shows a first example of a luminous module able to be used in the luminous device according to the invention.

FIG. 1 schematically shows an example of a luminous module. The luminous motor-vehicle module 10 comprises a monolithic electroluminescent source 12, for example an LED array, a PCB 14 (acronym of printed circuit board) that bears the source 12 and the device 19 for controlling the electroluminescence elements of the monolithic light source 12. Any other holder other than a PCB may be envisioned. The luminous module may furthermore comprise at least one heat sink 18 that may be arranged directly or indirectly on the source 12. In this example, the heat sink 18 is arranged indirectly on the source since the PCB 14 and a thermal interface 16 are located between the heat sink 18 and the source 12. The heat sink allows the heat of the electroluminescent source that the latter transmits to the PCB during use of a luminous module to be transferred. The heat sink allows heat to be dissipated via an interaction with the holder 14 of the monolithic electroluminescent source; i.e. the heat sink receives the heat produced by the electroluminescent source. The heat sink 18 is thus in thermal communication with the PCB 14, which itself is in thermal communication with the heat source 12. The transmission may be ensured by the fact that the heat sink is in one example arranged directly against the PCB 14. This means that the heat sink makes physical (i.e. material) contact with the PCB. The heat sink 18 may however alternatively be arranged on the interposer via an intermediate element that improves heat transfer. This intermediate element is also called the thermal interface 16. The intermediate element 16 may for example comprise a thermal grease or a phase-change material. The intermediate element may comprise copper, and for example the thermal interface 16 is a copper plate. Thus, the luminous module effectively dissipates heat.

A second example of a luminous module, which comprises a so-called "3D" monolithic electroluminescent source, i.e. the electroluminescent sources are not solely deposited on the substrate of the source: the electroluminescent elements extend from the substrate of the source, will now be discussed. The luminous module comprises a high number of semiconductor electroluminescent sources including a substrate mainly made of semiconductor. It is thus possible to make reference to the substrate using the expression "semiconductor substrate". The substrate may include one or more other materials, for example non-semiconductors. Therefore, the luminous module comprises at least a plurality of such elements extending from the first face of the substrate. The elements may be grouped together into one or more sets. Each set consists of a plurality of elements extending from a respective segment of the first face of the substrate. The electroluminescent elements may therefore be distributed in various light-emitting zones. In one example, these various zones may be selectively activatable. The elements may have a rod-like general shape and thus be called "rods". The electroluminescent elements may be supplied with electricity via the substrate from one side (e.g. the substrate for example forming the cathode) and via a layer of electrical conductor that electrically connects the electroluminescent elements together on the other side (e.g. the layer of electrical conductor forming for example the anode). The contact between the semiconductor of each electroluminescent element and the semiconductor of the substrate may therefore be suitable for electrical conduction. The layer of electrical conductor may cover the electroluminescent elements. The layer of electrical conductor may also cover each segment of surface of the substrate from which the electroluminescent elements extend, or any surface or face of the substrate from which the sets of electroluminescent elements extend. The layer of electrical conductor may be electrically insulated from the semiconductor of the substrate by any means. This allows the electroluminescent elements to be supplied with electricity via the substrate. Thus, it is possible to supply the electroluminescent elements with electricity simply, i.e. by giving the semiconductor of the substrate one polarity and the layer of electrical conductor the other polarity.

Still with reference to the second example, the electroluminescent source may be manufactured using a process comprising at least a step of providing the substrate, then a step of forming the rods integrally with the substrate by growth from the substrate. The layer of electrical conductor may be produced via a step of depositing a finishing metal, for example copper in order to allow the rods to be controlled. This step may also comprise creating aluminium or copper pads on one face of the substrate, said pads being suitable for wire or ribbon bonding between the source and the control component. Wire or ribbon bonding is one of the techniques used to form electrical connections between the electroluminescent source and the power supply device of the source. An electrical connection is simply produced by bonding a wire (or ribbon) to the two connection pads provided for this purpose on each of the elements. The bond may be achieved ultrasonically. The material of the wire or ribbon may be aluminium, gold or copper. The diameter of the wire may be about 20 µm. A ribbon of rectangular cross section may also be used.

Figure 2:
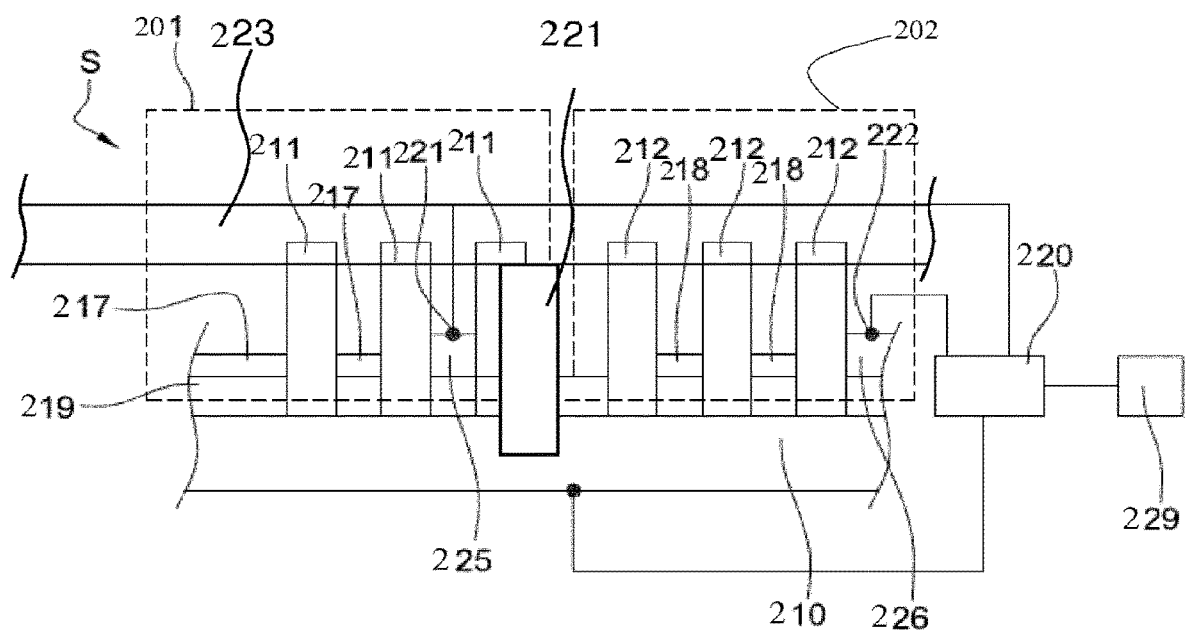
FIG. 2 schematically shows a second example of a luminous module able to be used in the luminous device according to the invention.

FIG. 2 shows an example of such a so-called "3D" monolithic electroluminescent light source. The light source S, here shown in cross section, comprises a substrate 210 from which rods 211, 212 extend in a privileged direction. This substrate 210 is, in particular in this example, a silicon substrate, this having a cost much lower than that of conventional LEDs, in which the substrates are made of sapphire. The rods 211, 212 may be obtained by crystalline growth on this substrate 210.

The rods 211, 212 are arranged so as to form rods made of electroluminescent semiconductor. The rods 211, 212, may for example be formed essentially from gallium nitride.

For example, these rods 211, 212, comprise a core made of a semiconductor able to be doped in electrons, around which is formed a first layer made of a semiconductor able to present deficits in electrons, in this case a layer doped in "holes" or in positive charges is sometimes spoken of. At the interface of this core and this first layer, an intermediate layer forms in which the electrons and the deficits in electrons recombine. Thus, each rod 211, 212, is an electroluminescent semiconductor element.

A nucleation layer 219 is formed on the substrate 210 and around the rods 211, 212.

The rods 211, 212 are, in this example, distant by about 30 µm and each have a height, measured from the nucleation layer 219 to the top thereof, of 2.5 µm. Their diameter is 1.5 µm. It will be understood that these values are given by way of indication and may vary.

The light source S therefore essentially comprises a substrate 210 forming a plate bristling with a multitude of small rods 211, 212 that are electroluminescent and of submillimetre size, i.e. the largest dimension thereof is smaller than one millimetre.

The light source S is divided into a plurality of luminous zones 201, 202 that are separated by divisions 221 that correspond to partitions of the set of all the rods 211, 212.

Between each rod 211, 212 of a given zone 201, 202 is deposited an electrically conductive layer that electrically links these rods, thus forming a separate anode 225, 226 for each of the luminous zones 201, 202.

The four anodes 225, 226 thus formed make contact with the nucleation layer 219, which itself makes contact with the cathode formed by the substrate 210.

Thus, by connecting the anodes 225, 226 and the cathode 210 to a power source, it is possible to supply each of the various luminous zones 201, 202 with electricity independently.

According to one embodiment, each anode is connected to one or more positive terminals by a connecting means 220, which is intended to be connected to the positive terminal of an electrical power source (not shown) of a vehicle. Likewise, the cathode 210 is connected to the negative terminal of the connecting means 220. The activating means therefore allows electrical power to be supplied to each of these luminous zones 201, 202.

It is therefore possible to drive this light source S, by selectively activating its luminous zones 201, 202, via the activating means 220.

This driving may also be achieved via a specific means separate from the luminous device, or indeed, as in this example, by a driver 229 that is integrated into the luminous device.

In this example, the driving is achieved directly via a driver 229. The latter is connected on the one hand to the connecting means 220 and on the other hand to the connector C. The connecting means 220 is for its part connected to each anode 225, 226, via electrical conductors.

The driver 229 and the light source S are mounted on the same printed circuit board (not shown). The electrical conductors are formed by electronic tracks of this printed circuit board. Likewise, other electronic tracks connect the connecting means 220 to the driver 229.

The luminous efficacy of the luminous zones 201, 202 may be improved by depositing a reflective layer 217, 218 on the nucleation layer 219. This reflective layer 217, 218 is for example deposited on the nucleation layer 219 before growth of the rods, then holes are produced in this reflective layer 217, 218, and in the nucleation layer, before growth of the rods 211, 212, 213, 214 on the substrate 10.

In order to obtain a better luminous efficacy, the rods of the luminous zones may have the following features:

a diameter comprised between 1.4 µm and 1.6 µm, for example 1 µm, a height comprised between 2 µm and 10 µm, for example 8 µm, a distance between each rod comprised between 3 and 10 µm.

The light source S may comprise a light converter 223 arranged above the rods 211, 212. A light converter comprises at least one luminescent material designed to absorb at least some of at least one exciting emission emitted by a light source and to convert at least some of said absorbed exciting emission into a luminous emission having a wavelength different from that of the exciting emission. The material may for example be cerium—or europium-doped YAG.

Again in the example of FIG. 2, the light source is a high-density source, i.e. it comprises a very high number of sets of electroluminescent elements, at least several hundred sets of electroluminescent elements.

The luminous device according to the invention also comprises an optical system 302 that is arranged to form an image of the monolithic electroluminescent source. The image may be a real image or indeed even a virtual image. The optical system is therefore placed downstream of the monolithic electroluminescent source in the direction of travel of the emitted light.

The optical system may comprise a forming optic, i.e. at least one of the rays emitted by the light source is deviated by the forming optic. The term "deviated" means that the direction of entrance of the light ray into the forming optic is different from the direction of exit of the light ray from the forming optic. The optical system comprises at least one optical element such as one or more lenses, or one or more reflectors, one or more light guides or a combination of these possibilities.

In FIG. 3, the optical system 302 is not comprised in the luminous module 300. This allows the optical system to be preserved when the luminous module is faulty. It will be understood that the system could be comprised in the luminous module 300. The optical system may have a resolution that is lower than or equal to 0.25 degrees and a field larger than or equal to 5 degrees.

The luminous device according to the invention comprises one (or more than one) electronic device(s) 330 able to control the electroluminescent elements of the electroluminescent source. Such an electronic device may for example be an integrated circuit or a power converter.

A power converter is a device for converting a supply of electrical power obtained from a vehicle electrical network into an electrical supply suitable for the performance of a desired luminous function, and optionally for delivering said suitable electrical supply to an electroluminescent source for the performance of said desired luminous function.

An integrated circuit, also called an electronic chip, is an electronic component that performs one or more electronic functions and that may incorporate several types of basic electronic components, for example in a small volume (i.e. on a small chip). This makes the circuit easy to implement.

The integrated circuit may for example be an ASIC or an ASSP.

An ASIC (acronym of application-specific integrated circuit) is an integrated circuit developed for at least one specific application (i.e. for a customer). An ASIC is therefore a specialized (microelectronic) integrated circuit. In general, it has many unique or made-to-measure functionalities.

An ASSP (acronym of application-specific standard product) is an integrated (microelectronic) electronic circuit having many functionalities for addressing an application that is generally standardized. An ASIC is designed for a more particular (specific) need than an ASSP.

Electricity is supplied to the electroluminescent source, and therefore to the electroluminescent elements, via the electronic device, which itself is supplied with electricity for example using at least one connector that connects it to a source of electricity. The electronic device thus supplies the electroluminescent elements with electricity. The electronic device is thus able to control the electroluminescent elements.

The luminous modules of the examples of FIGS. 1 and 2 each comprise at least one driver 19, 229 (also called a driver) integrated into the luminous module. In this particular case, the one or more electronic devices 330 configure the one or more drivers of the luminous module: they transmit a configuration to the one or more drivers of the luminous module in order that they drive the turn-on of one or more electroluminescent elements of the source. It will be understood that the one or more electronic devices 330 may conversely transmit a configuration to the one or more drivers of the luminous module in order that they drive the turn-off of one or more electroluminescent elements of the source.

When the luminous module does not comprise any driver 19, 229, the driving is achieved directly by the electronic device, which will configure the one or more drivers of the monolithic electroluminescent source.

Thus, the electronic device 330 is able to directly control the electroluminescent elements of the source, or alternatively it is able to indirectly control the electroluminescent elements of the source by configuring the one or more drivers of the one or more luminous modules, a combination of these possibilities also being envisionable.

The electroluminescent elements are configured depending on measurements received by the electronic device 330, i.e. the electronic device determines which electroluminescent elements of the monolithic electroluminescent source must be turned on depending on parameters that it receives. More precisely, the electronic device 330 receives measurements of these parameters. The measurements used will now be discussed.

The electronic device 330 is able to receive first measurements regarding at least one physical parameter of the vehicle. A physical parameter of the vehicle is any measurable characteristic of the vehicle, and it in particular varies when the vehicle is moving. A physical parameter of the vehicle may be, but is not limited to, the speed of the vehicle, the acceleration of the vehicle, the drift angle of the steerable wheels (or of the steerable wheel) of the vehicle, the roll angle of the vehicle, the pitch angle of the vehicle, the geoposition of the vehicle (GPS coordinates or coordinates provided by another system), the compression/decompression of the suspension of the vehicle, the activation of a brake pedal, clutch pedal, accelerator, etc.

The electronic device 330 is also able to receive second measurements that relate to at least one physical parameter of the scene illuminated by the optical system (302). This physical parameter of the scene may be light emitted by the scene, for example light emitted by a white luminous strip on the road illuminated by the optical system 302 or even light reflected and/or emitted by another vehicle, a streetlamp, a road sign, etc. The physical parameter of the scene may also comprise cartographic information of the latter, which may for example be delivered by a GPS guidance system. This cartographic information may comprise, but is not limited to, the curvature of the road, altitude, the presence of an intersection, the presence of a piece of infrastructure (bridge, tunnel, etc.), etc.

The electronic device 330 may receive the first and/or second measurements synchronously. It is therefore a question of a transmission mode employing a synchronous link, in which the emitter of the measurements and the receiver of the measurements are clocked by the same clock. The receiver continuously receives (even when no bits are transmitted) information at the rate at the which the emitter sends it.

Alternatively, the electronic device 330 may receive the first and/or second measurements asynchronously. It is therefore a question of a transmission mode employing an asynchronous link, in which the emitter of the measurements sends to the receiver the data of the measurements and the clock signal.

A combination of these transmission modes may be envisioned. For example, the electronic device 330 may receive the first measurements synchronously and the second measurements asynchronously, or indeed vice versa.

In practice, the exchanges of information in which the luminous device according to the invention participates are based on asynchronous exchanges, which facilitate the overall management of the transmissions and of the computations carried out by the electronic device 330. Synchronous exchanges may also take place—although they are more rapid, they require more data to be transmitted.

The measurements of the physical parameters received by the electronic device 330 are carried out by sensors that may belong to the device, or indeed in contrast that do not belong to the device. In the first case, this means that sensors must be installed in the vehicle in order for the electronic device to be able to receive the measurements necessary to correctly configure the electroluminescent elements of the source. In the second case, this means that the device according to the invention takes advantage of sensors that are already present in the vehicle: the sensors are connected to the luminous device according to the invention in order for the electronic device to be able to receive the measurements required to correctly configure the electroluminescent elements of the source. Lastly, it is also possible to combine these two cases, for example to add to the vehicle one or more sensors that are not installed in the latter.

In practice, the vehicle comprises many sensors that measure physical parameters of the vehicle and it is not necessary to add any more. The luminous device according to the invention will therefore preferably exploit the measurements made by these sensors in order to not complexify the construction of the vehicle. For example, the speed of the vehicle is continuously measured by a speed sensor that transmits it to the on-board computer of the vehicle, which in turn may transmit, for example asynchronously, the measured values to the electronic device 330. The same goes for other physical parameters of the vehicle such as its acceleration, the drift angle of its steerable wheels, its roll, the pitch of the vehicle, its geoposition, the compression/decompression of the suspension of the vehicle, etc. Thus, there are as many types of first measurements as there are types of sensors of physical parameters of the vehicle. Preferably, the device according to the invention is able to determine with precision the orientation of the vehicle using information regarding (i) the pitch angle of the vehicle, which may be delivered by sensors of acceleration, deceleration, braking, suspension, and (ii) regarding the roll angle of the vehicle, which may be delivered by sensors measuring the angle of the steerable wheels or the angle of the steering wheel or the speed of the vehicle or sideways accelerations.

Regarding the physical parameters of the scene, these parameters may be captured by a camera 310 placed on the vehicle, and/or by an infrared camera and/or a radar and/or a lidar. The infrared camera, radar and lidar allow non-reflective objects such as for example pedestrians or animals to be detected. The camera produces an image stream, for example of 25 to 30 images per second. Each image produced by the camera captures the luminosity of objects present in the illuminated scene. The camera, as sensor, may be associated with a unit 312 for analysing the image stream that it produces. Specifically, the images contain a very large amount of information that may be too much for the electronic device 330 to process. The analysing unit 312 extracts the relevant information of each image of the image stream produced by the camera, for example using image-processing algorithms. In the context of a luminous land-vehicle device, the relevant information may be, but is not limited to, the detection of objects such as an oncoming vehicle, a road user (motorcyclist, cyclist, etc.), a pedestrian, an animal, traffic signals such as road markings, road signs, etc. The data contained in the images may therefore be segmented and categorized in order to allow the electronic device to determine what objects are present and what is the location of each of the objects with respect to the vehicle. Image segmentation is an image-processing operation, the aim of which is to group pixels together according to predefined criteria. The pixels are thus grouped into regions, which form a tiling or a partition of the image. For example, the assignment of a moving vehicle to a first segment may be based on detection of its front lights or its rear lights. Depending on the nature of the object, its dimensions and its location with respect to the vehicle, the electronic device will determine whether it is necessary to illuminate it or not, or even with which intensity to illuminate it.

Physical parameters may also be measured by sensors that are not placed on the vehicle. For example, information regarding traffic signals may be transmitted to the vehicle by terminals located in proximity to the road. Furthermore, information regarding traffic (for example a hazard on the route of the vehicle) may be transmitted via a telecommunication system such as a mobile telecommunication network.

Again to avoid the electronic device 330 having to perform computations, the analysing unit 312 may also use segmentation results computed beforehand to make a prediction on the nature of the objects present and their location. Predictive image-analysing filters may be used, for example a Kalman filter or a particle filter.

It will be understood that when the camera comprises an analysing unit 312, it is the latter that transmits to the electronic device 330 the performed measurements—in this case, it is more precisely a question of information extracted from the images produced by the camera.

As discussed above, the information is preferably transmitted asynchronously; synchronous transmission is however envisionable. The transmission is carried out using one or more communication buses, for example using communication buses already present in the vehicle. Of course, any type of communication bus is envisionable, but wired transmission is preferred for reasons of transmission rapidity and reliability. Thus, a standardized controller area network or CAN (i.e. a system of asynchronous series buses) according to standard ISO 11898 may be used.

In practice, each of the sensors measuring one physical parameter of the vehicle is able to deliver a measurement more frequently than the camera: specifically, the analysis of the images produced by the camera involves processing operations that require many computations that take more time than a simple acquisition of a value of one physical parameter. For example, the refresh frequency of the sensors measuring the physical parameters of the vehicle may be about 100-200 hertz (Hz), whereas the refresh frequency of the camera may be three times lower (i.e. about 25-30 Hz). Preferably, the refresh frequency of the sensors measuring the physical parameters of the vehicle is 20 Hz, and the refresh frequency of the sensors measuring the parameters of the scene is 5 Hz. In other words, the electronic device may receive at least three times more measurements per sensor of the physical parameters of the vehicle and per unit time than physical scene parameters captured using a camera. Thus, the measurements of the physical parameters of the vehicle may be used by the electronic device to configure the electroluminescent elements and the measurements obtained by the camera may be used to correct, if necessary, the configurations obtained with the measurements of the physical parameters. In addition, the higher refresh frequency of the measurements of the physical parameters allows the turn-on or turn-off of the elements of the source to be rapidly controlled.

Furthermore, it may be possible for the electronic device to not refresh the configuration of the electroluminescent elements of the source on each new arrival of received measurements in order to decrease the number of configurations that must be transmitted to the one or more drivers of the luminous module.

Figure 4:
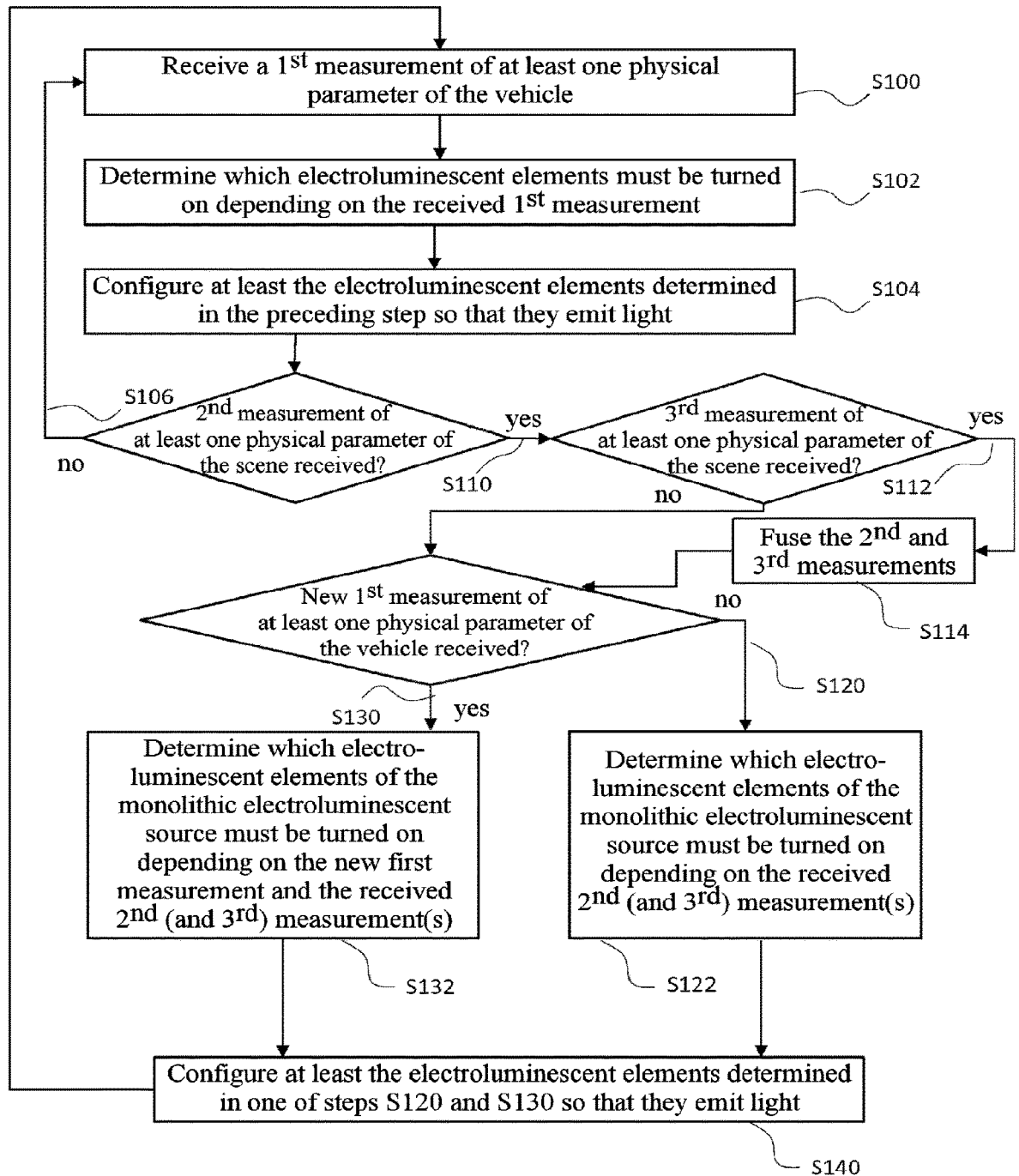
FIG. 4 shows a flowchart of one example of a method for illuminating a scene according to the invention.

An example of a method for illuminating a scene with the luminous device according to the invention will now be discussed. This discussion is given with reference to the flowchart of FIG. 4. In this example, at least one electroluminescent element of the luminous device is turned on before the first step of the method is carried out, though it will be understood that the same method could be applied if the electroluminescent source were turned off before the first step of the method was carried out.

In step S100, the electronic device receives at least one first measurement of at least one physical parameter of the vehicle. In practice, each sensor transmits a measurement as soon as it has been acquired via a suitable means, for example an asynchronous communication bus connecting it to the electronic device.

In step 102, the electronic device determines which electroluminescent elements must be turned on depending on one or more than one of the received measurements of the physical parameters of the vehicle.

Next, in step S104, the electronic device determines which electroluminescent elements must be turned on depending on one or more than one of the received measurements. This step may be carried out as soon as a new measurement is delivered to the electronic device, or indeed it may wait to have received at least one measurement from each of the sensors. Another possibility is that the electronic device perform the determination at a given frequency, independently of whether or not a new measurement has been received from all or some of the sensors present.

A configuration of the electroluminescent elements that must be turned on is obtained, which is sent to the one or more drivers of the monolithic electroluminescent source for execution. The lighting provided by the vehicle is modified if the measurements delivered by the sensors of the physical parameters of the vehicle mean a correction is required.

Provided that no measurement of a physical parameter of the scene has been delivered to the electronic device 330 (S106), steps S100, S102, S104 are repeated so that the lighting is configured solely depending on the physical parameters of the vehicle.

In step S110, the electronic device receives at least one second measurement of at least one physical parameter of the scene. For example, the analysing unit 312 transmits the result of the analysis of one or more images of the image stream generated by the camera.

If the device comprises a plurality of sensors that capture different physical parameters of the scene, for example a camera for identifying reflective objects and an infrared camera for identifying non-reflective objects, the electronic device may receive at least one third measurement of at least one physical parameter of the scene (step S112) that is different from the physical parameter of the second measurement. For example, a camera may have delivered the second measurement and an infrared camera a third measurement. In this case, the second and third measurements are fused (step S114) in order to provide consolidated information on the physical parameters of the scene.

In step 122, the electronic device determines which electroluminescent elements must be turned on depending on the received second measurement or indeed depending on the fused second and third measurements. Before this step S122, no new measurements were delivered by the sensors of the physical parameters of the vehicle (step S120) after step S110 or S114 was carried out. A correction is thus applied using information gathered by the camera to the configuration computed beforehand on the basis of the first measurements.

Alternatively, a step S132 may be carried out in which the electronic device determines which electroluminescent elements must be turned on depending on the received second measurement—or indeed depending on the fused second and third measurements—and depending on new measurements that were delivered by the sensors of the physical parameters of the vehicle (step 130) to the electronic device after step S110 or S114 was carried out, i.e. after a second measurement or a third measurement was received.

The new configuration of the electroluminescent elements that must be turned on is transmitted in turn to the one or more drivers of the monolithic electroluminescent source for execution, in step S140. The lighting produced by the light source is modified.

The method is repeated starting with step S100 until there is no longer any need for the luminous device to illuminate the scene, the luminosity of the scene captured by the camera for example being judged to be suitable by the electronic device.

The invention claimed is:

1. A luminous land-vehicle device for illuminating a scene, comprising:
   a monolithic electroluminescent source comprising electroluminescent elements;
   an optical system arranged to form an image of the monolithic electroluminescent source; and
   an electronic device configured to receive at least one first measurement regarding at least one physical parameter of a vehicle, the luminous land-vehicle device being integrated with the vehicle, receive at least one second measurement regarding at least one physical parameter of the scene, and control illumination of the electroluminescent elements of the monolithic electroluminescent source depending on the received at least one first measurement and the received at least one second measurement, wherein a refresh frequency of the at least one first measurement is higher than a refresh frequency of the at least one second measurement.

2. The luminous land-vehicle device according to claim 1, wherein the electronic device comprises at least one of a power converter and an integrated circuit.

3. The luminous land-vehicle device according to claim 2, wherein the electronic device receives the at least one first measurement and the at least one second measurement asynchronously.

4. The luminous land-vehicle device according to claim 2, wherein the refresh frequency of the at least one first measurement is at least three times higher than the refresh frequency of the at least one second measurement.

5. The luminous land-vehicle device according to claim 2, further comprising at least one first sensor that generates the at least one first measurement.

6. The luminous land-vehicle device according to claim 2, further comprising at least one second sensor that generates the at least one second measurement.

7. The luminous land-vehicle device according to claim 2, further comprising a heatsink arranged on at least the monolithic electroluminescent source.

8. The luminous land-vehicle device according to claim 1, wherein the refresh frequency of the at least one first measurement is at least three times higher than the refresh frequency of the at least one second measurement.

9. The luminous land-vehicle device according to claim 1, further comprising at least one first sensor that generates the at least one first measurement.

10. The luminous land-vehicle device according to claim 1, further comprising at least one second sensor that generates the at least one second measurement.

11. The luminous land-vehicle device according to claim 10, wherein the at least one second sensor is a camera that produces an image stream.

12. The luminous land-vehicle device according to claim 11, wherein the at least one second sensor comprises processing circuitry configured to analyze the image stream produced by the camera.

13. The luminous land-vehicle device according to claim 12, wherein the analysis of the image stream includes segmenting operations on images of the image stream.

14. The luminous land-vehicle device according to claim 1, further comprising a heatsink arranged on at least the monolithic electroluminescent source.

15. The luminous land-vehicle device according to claim 1, wherein the optical system has a resolution that is lower than or equal to 0.25 degrees and a field larger than or equal to 5 degrees.

16. A method for illuminating a scene with a luminous land-vehicle device, comprising:

receiving, by an electronic device, a first measurement of at least one physical parameter of a vehicle, the luminous land-vehicle device being integrated with the vehicle;

determining, by the electronic device and based on the received first measurement, which electroluminescent elements of a monolithic electroluminescent source must be turned on; and configuring, by the electronic device, at least the determined electroluminescent elements of the monolithic electroluminescent source so that they emit light.

17. The method according to claim 16, further comprising:

receiving, by the electronic device, a second measurement of at least one physical parameter of the scene, determining, by the electronic device and based on the received second measurement, which electroluminescent elements of the monolithic electroluminescent source must be turned on, and configuring, by the electronic device, at least the determined electroluminescent elements of the monolithic electroluminescent source so that they emit light.

18. The method according to claim 16, further comprising:

receiving, by the electronic device, a second measurement and a third measurement of at least two physical parameters of the scene, fusing, by the electronic device, the received second measurement and the received third measurement, receiving, by the electronic device, a new first measurement of the at least one physical parameter of the vehicle, determining, by the electronic device and based on the received second measurement, the received third measurement, and the received new first measurement, which electroluminescent elements of the monolithic electroluminescent source must be turned on, and configuring, by the electronic device, at least the determined electroluminescent elements of the monolithic electroluminescent source so that they emit light.

19. The method according to claim 16, wherein, provided that a second measurement of at least one physical parameter of the scene is not received, the receiving, by the electronic device, the first measurement of the at least one physical parameter of the vehicle, the determining, by the electronic device and based on the received first measurement, which electroluminescent elements of the monolithic electroluminescent source must be turned on, and the configuring, by the electronic device, at least the determined electroluminescent elements of the monolithic electroluminescent source so that they emit light are repeated.

* * * * *